United States Patent
Li et al.

(10) Patent No.: US 6,531,380 B2
(45) Date of Patent: Mar. 11, 2003

(54) METHOD OF FABRICATING T-SHAPED RECESSED POLYSILICON GATE TRANSISTORS

(75) Inventors: Xia Li, Singapore (SG); Chock Hing Gan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/968,831

(22) Filed: Oct. 3, 2001

(65) Prior Publication Data

US 2002/0016042 A1 Feb. 7, 2002

Related U.S. Application Data

(62) Division of application No. 09/584,427, filed on Jun. 5, 2000, now Pat. No. 6,309,933.

(51) Int. Cl.$^7$ ............................................. H01L 21/336
(52) U.S. Cl. ...................... 438/579; 438/300; 438/592; 438/291
(58) Field of Search ......................... 438/291, 268–272, 438/305, 306, 589, 592, 595, 579

(56) References Cited

U.S. PATENT DOCUMENTS

| | | | |
|---|---|---|---|
| 5,559,049 A | * 9/1996 | Cho | |
| 5,621,233 A | 4/1997 | Sharma et al. | 257/316 |
| 5,688,704 A | 11/1997 | Liu | |
| 5,783,479 A | 7/1998 | Lin et al. | 438/592 |
| 5,817,558 A | 10/1998 | Wu | 438/291 |
| 5,940,697 A | 8/1999 | Yoo et al. | 438/182 |
| 6,303,448 B1 | * 10/2001 | Chang et al. | 438/300 |

* cited by examiner

Primary Examiner—David Nelms
Assistant Examiner—Dung Le
(74) Attorney, Agent, or Firm—George O. Saile; Rosemary L. S. Pike; Stephen G. Stanton

(57) ABSTRACT

A method of fabricating a semiconductor transistor device comprising the following steps. A semiconductor structure is provided having an upper silicon layer, a pad dielectric layer over the upper silicon layer, and a well implant within a well region in the upper silicon layer. A lower SiN layer is deposited and patterned over the pad dielectric layer to define a lower gate area. The pad dielectric layer and the upper silicon layer within the lower gate area is etched to form a lower gate trench having a predetermined width. A lower gate portion is formed within the lower gate trench. An upper oxide layer is formed over the lower SiN layer. An upper SiN layer is formed over the upper oxide layer. The upper SiN layer is etched to define an upper gate trench having a predetermined width greater than the lower gate trench predetermined width. An upper gate portion is formed within the upper gate trench, wherein the lower and upper gate portions form a T-shaped gate. The etched upper SiN, upper oxide, and lower SiN layers are removed to expose the T-shaped gate extending above the pad dielectric layer. An uppermost oxide layer is formed over the exposed T-shaped gate. SiN sidewall spacers are formed adjacent the exposed vertical side walls of the lower polysilicon gate portion. Silicide regions are formed over the T-shaped gate and source/drain regions.

38 Claims, 7 Drawing Sheets

METHOD OF FABRICATING T-SHAPED RECESSED POLYSILICON GATE TRANSISTORS

This is a division of patent application Ser. No. 09/584,427, filing date Jun. 5, 2000, now U.S. Pat. No. 6,309,933 Method Of Fabricating T-Shaped Recessed Polysilicon Gate Transistors, assigned to the same assignee as the present invention.

FIELD OF THE INVENTION

The present invention relates generally to formation of semiconductor devices, and more specifically the formation of T-shaped polysilicon gates used in semiconductor devices.

BACKGROUND OF THE INVENTION

The requirement of increasingly small design rule for complementary metal-oxide semiconductor (CMOS) processes conflict with the requirements of salicide (self-aligned silicide) processes because very shallow junctions lead to junction leakage. On the other hand, the salicide sheet resistance (rho) of the polysilicon gate increases quickly when the width of the polysilicon gate scales down to the deep submicron range, e.g. 0.25 µm. The higher salicide sheet rho of the polysilicon gate reduces circuit speed.

U.S. Pat. No. 5,817,558 to Wu describes a semiconductor processing method for forming self-aligned T-gate lightly-doped drain (LDD) device having a recessed channel. An oxide layer is formed over a substrate followed by forming a nitride layer over the oxide layer. The nitride and oxide layers are etched to expose the underlying substrate and to define a gate region. Polysilicon spacers are formed of the side walls of the nitride layer then an anisotropic etch is used to etch the sidewall spacers and the exposed substrate to form a T-shaped groove. Amorphous silicon is deposited, filling the T-shaped groove then the excess amorphous silicon and the nitride layer is removed to form a T-gate.

U.S. Pat. No. 5,621,233 to Sharma et al. describes electrically programmable read-only memory cells having T-shaped floating gates and control gates that surround almost all of the T-shaped floating gates except those that lie on a gate dielectric layer.

U.S. Pat. No. 5,940,697 to Yoo et al. a method for forming a T-gate structure in a metal-semiconductor field effect transistor (MESFET) that includes dielectric lift-off steps.

U.S. Pat. No. 5,559,049 to Cho describes a method of manufacturing a semiconductor device having a T-shaped gate electrode. Auxiliary gates are capacitively coupled with the T-shaped gate at undercut portions below both sides of the T-shaped gate.

U.S. Pat. No. 5,688,704 to Liu describes a method of fabricating an integrated circuit having a T-shaped polysilicon gate that facilitates the formation of rectangular-shaped silicon nitride spacers.

U.S. Pat. No. 5,783,479 to Lin et al. describes a structure and method for fabricating field effect transistors (FETs) having T-shaped gates that can reduce the parasitic resistance of the gate and source/drain.

SUMMARY OF THE INVENTION

Accordingly, it is an object of the present invention to provide a method of forming a T-shaped recessed gate conductor for a semiconductor device that increases the surface area of the polysilicon gate and reduces the silicide sheet resistance (rho) of the polysilicon gate.

Another object of the present invention is to provide a method of forming a T-shaped recessed gate conductor for a semiconductor device that resolves the conflict with a shallow junction and a silicide process by not requiring too shallow a junction and thus minimizes junction leakage.

A further object of the present invention is to provide a method of forming a T-shaped recessed gate conductor for a semiconductor device such that the recessed gate conductor makes it easy to control the efficient gate length by accurately controlling the source/drain implantation energy.

Other objects will appear hereinafter.

It has now been discovered that the above and other objects of the present invention may be accomplished in the following manner. Specifically, a semiconductor structure is provided having an upper silicon layer, a pad dielectric layer over the upper silicon layer, and a well implant within a well region in the upper silicon layer. A lower SiN layer is deposited and patterned over the pad dielectric layer to define a lower gate area. The pad dielectric layer and the upper silicon layer within the lower gate area is etched to form a lower gate trench having a predetermined width. A lower gate portion is formed within the lower gate trench. An upper oxide layer is formed over the lower SiN layer. An upper SiN layer is formed over the upper oxide layer. The upper SiN layer is etched to define an upper gate trench having a predetermined width greater than the lower gate trench predetermined width. An upper gate portion is formed within the upper gate trench, wherein the lower and upper gate portions form a T-shaped gate. The etched upper SiN, upper oxide, and lower SiN layers are removed to expose the T-shaped gate extending above the pad dielectric layer. An uppermost oxide layer is formed over the exposed T-shaped gate. SiN sidewall spacers are formed adjacent the exposed vertical side walls of the lower polysilicon gate portion. Silicide regions are formed over the T-shaped gate and source/drain regions.

BRIEF DESCRIPTION OF THE DRAWINGS

The features and advantages of the method fabricating a T-shaped gate conductor according to the present invention will be more clearly understood from the following description taken in conjunction with the accompanying drawings in which like reference numerals designate similar or corresponding elements, regions and portions and in which:

FIGS. 1 to 9 and 16 to 19 schematically illustrate in cross-sectional representation a second preferred embodiment of the present invention.

DETAILED DESCRIPTION OF THE PREFERRED EMBODIMENT

First Embodiment of the Invention

Figure 1:
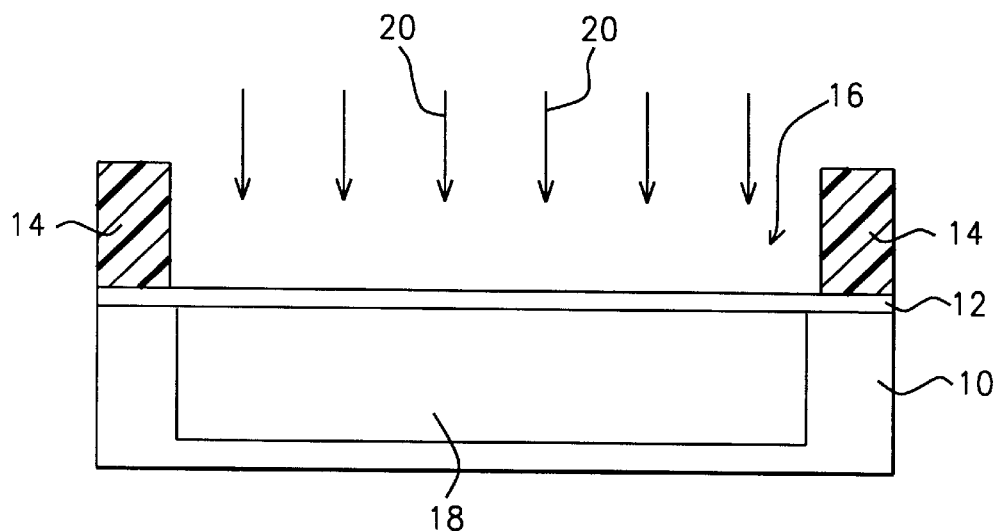
FIGS. 1 through 15 schematically illustrate in cross-sectional representation a first preferred embodiment of the present invention.
Figure 2:
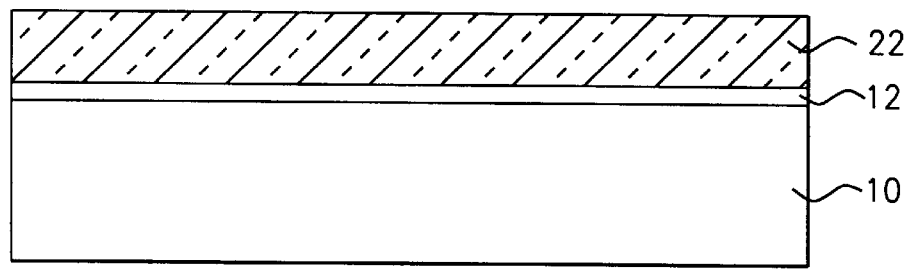
Figure 3:
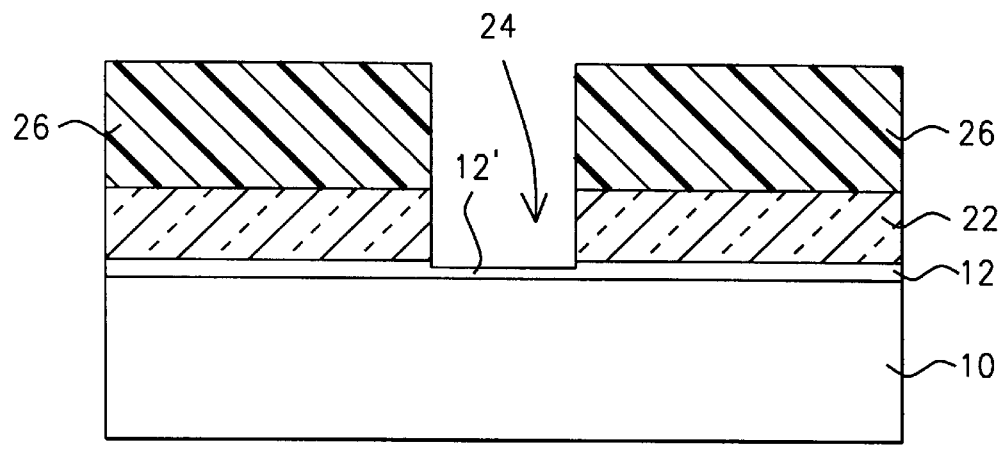
Figure 4:
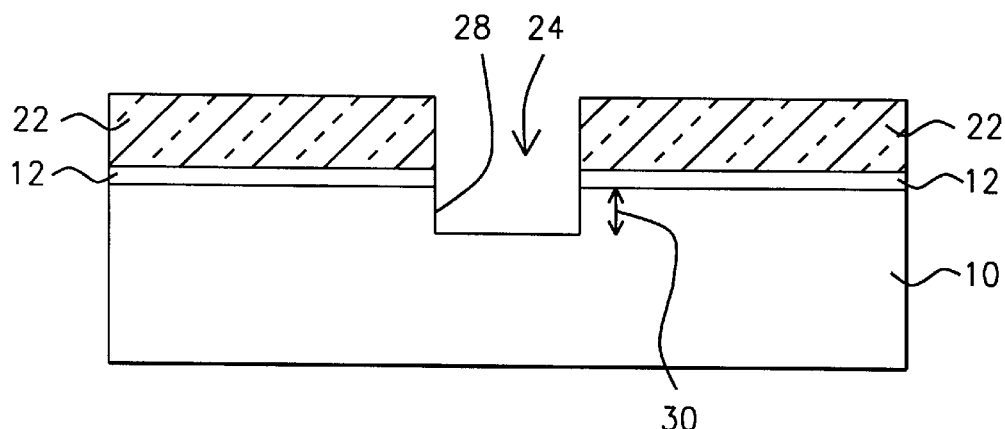
Figure 5:
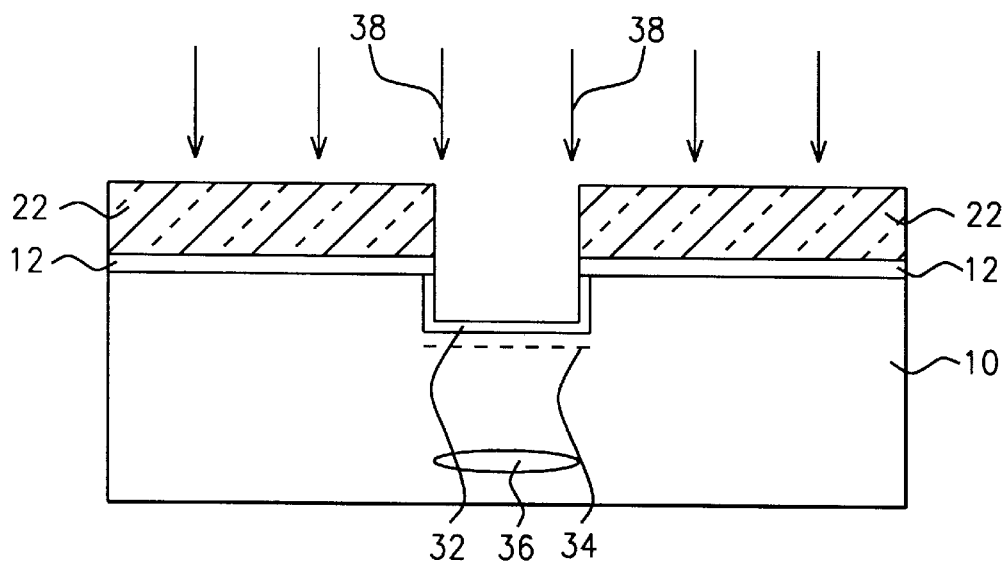
Figure 6:
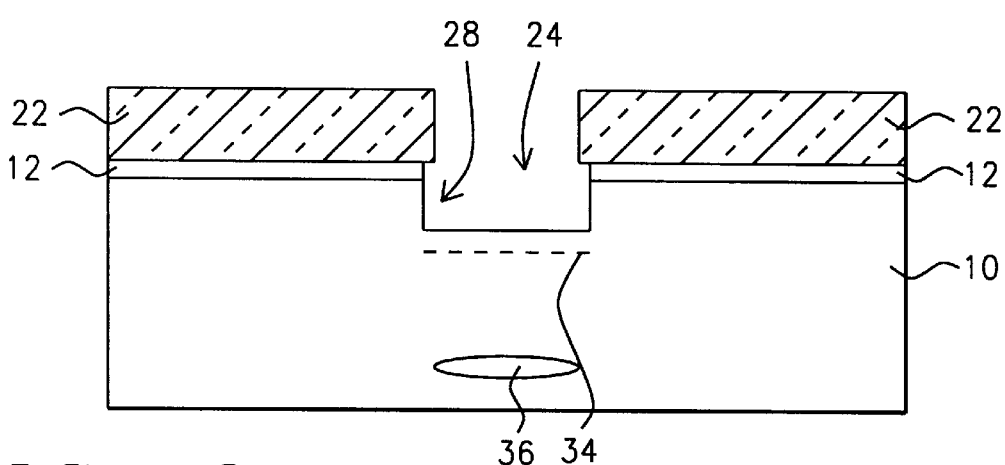

A brief summary of the first embodiment of the invention is:

FIG. 1: Grow pad oxide, define well mask, well implant;

FIG. 2: Strip photoresist; clean; lower silicon nitride layer deposit;

FIG. 3: Define polysilicon gate mask 1; etch lower nitride layer stopping on the pad oxide/dielectric layer;

FIG. 4: Strip photoresist; strip pad oxide in trench area; etch silicon substrate trench;

FIG. 5: Grow sacrificial liner oxide; threshold and punch-through implant;

FIG. 6: Remove sacrificial liner oxide; clean

Figure 7:
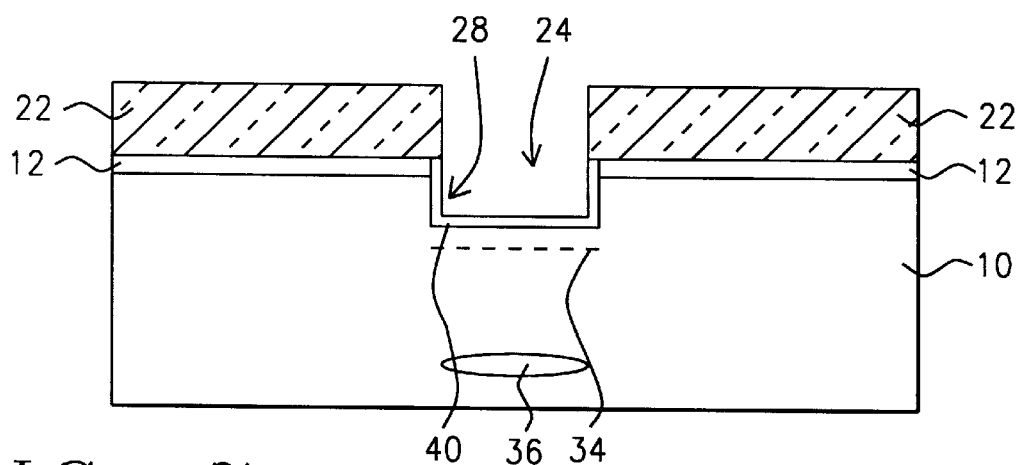
Figure 8:
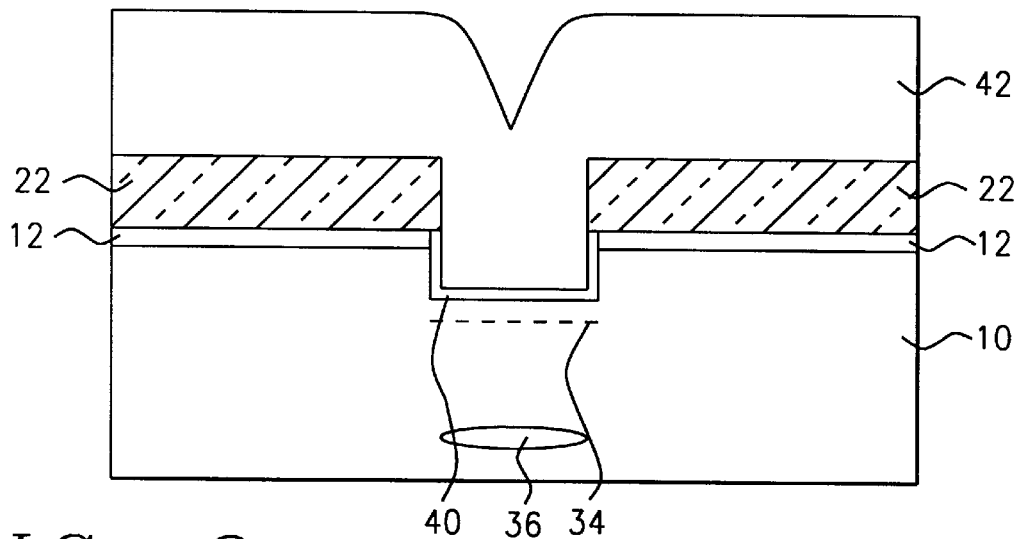
Figure 9:
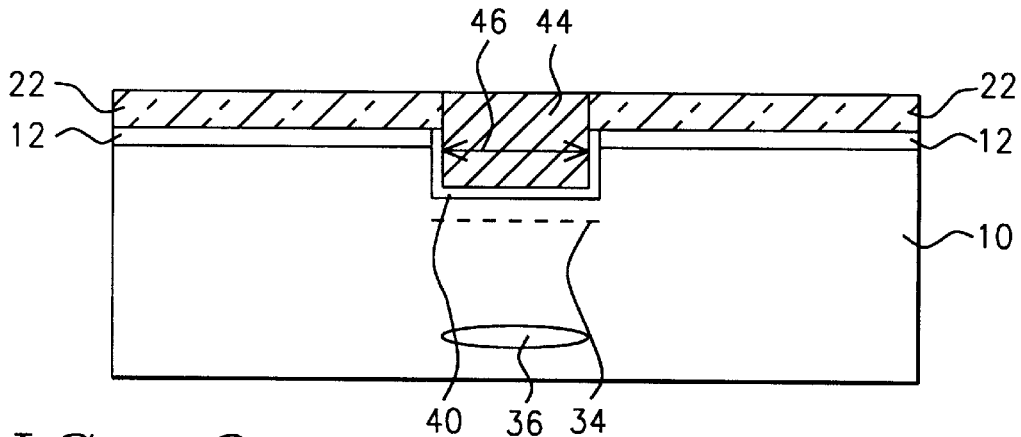
Figure 10:
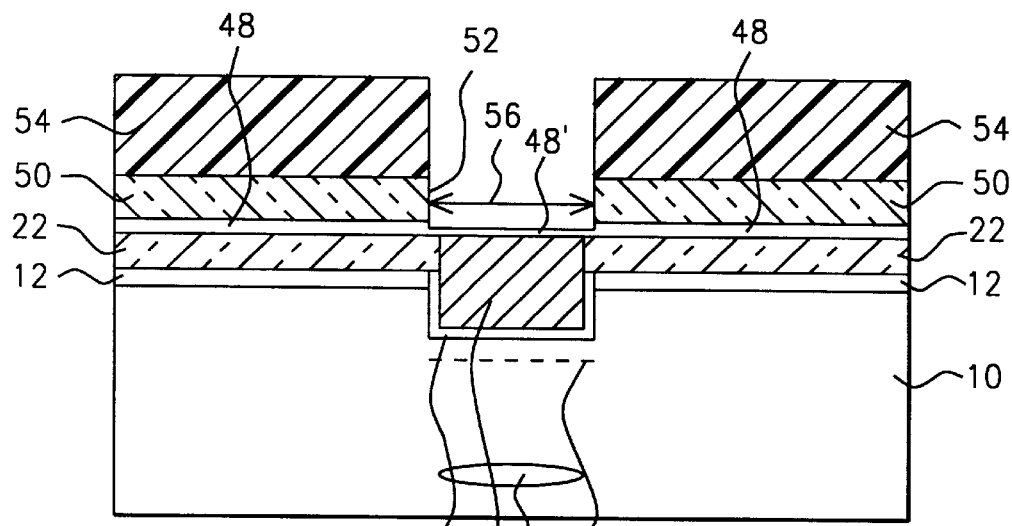
Figure 11:
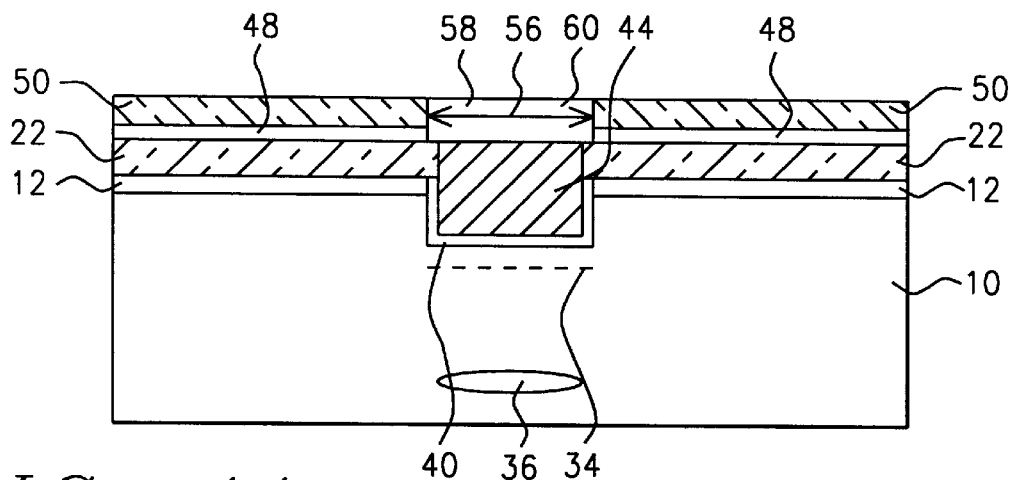
Figure 12:
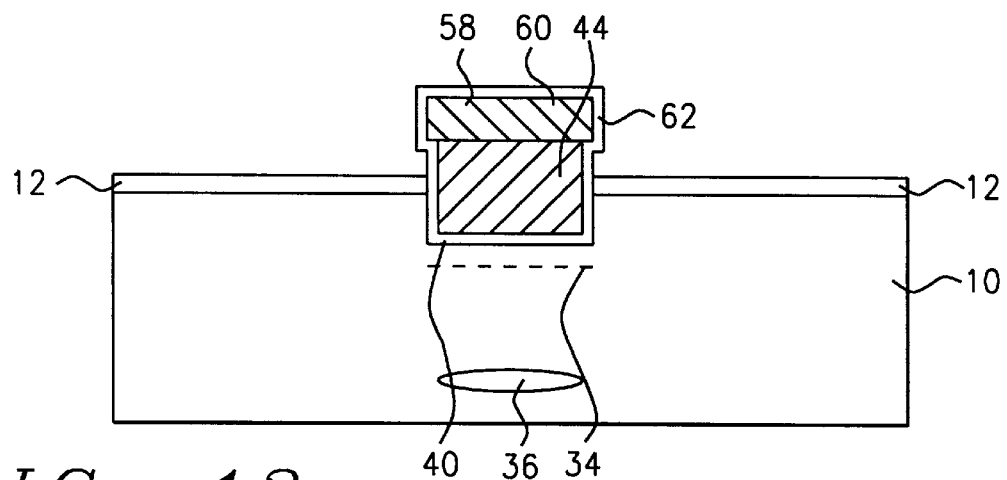
Figure 13:
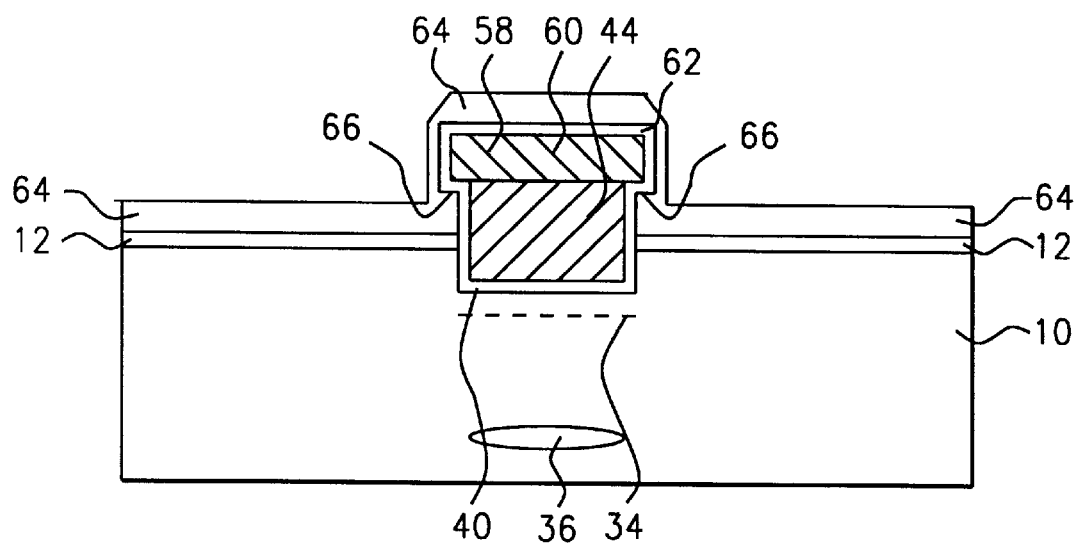
Figure 14:
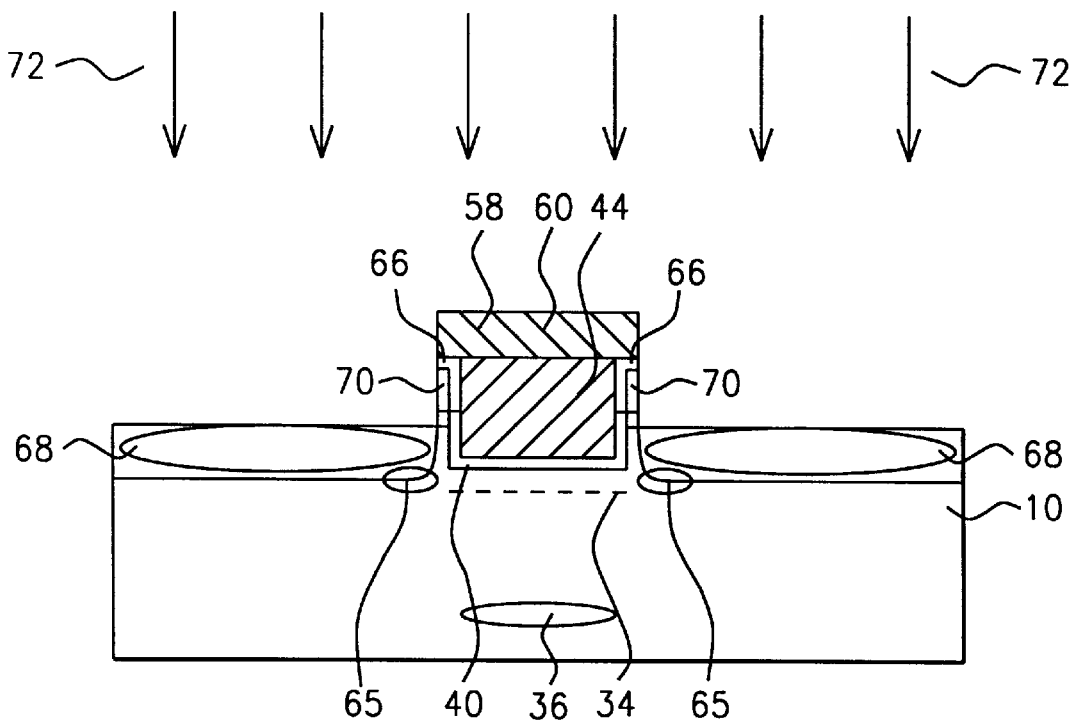
Figure 15:
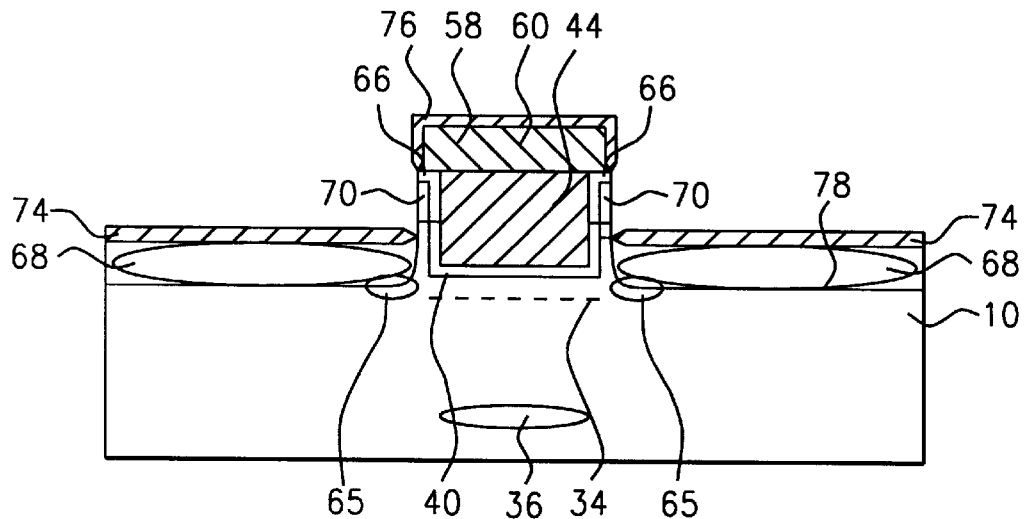
Figure 16:
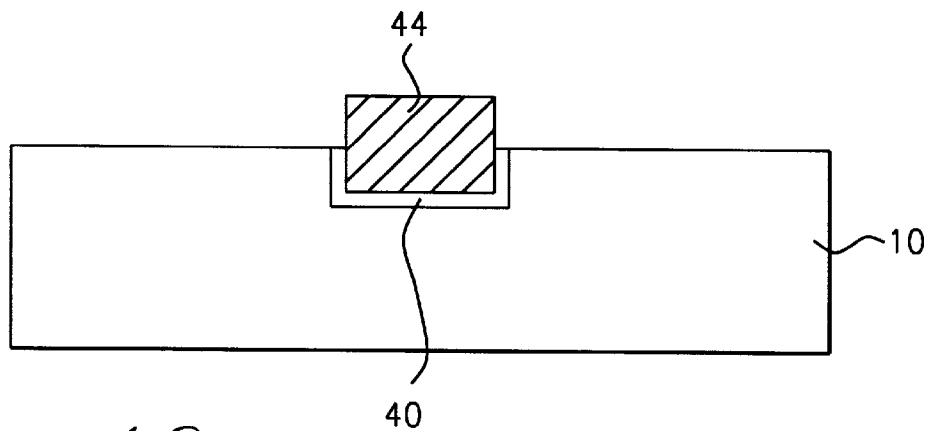

FIG. 7: Grow gate oxide;

FIG. 8: Deposit polysilicon;

FIG. 9: CMP (chemical-mechanical polish) polysilicon stopping on lower silicon nitride layer;

FIG. 10: Clean; deposit upper oxide layer then upper silicon nitride layer; define polysilicon gate mask 2 which is oversized from polysilicon gate mask 1; etch silicon nitride layer stopping on upper oxide layer;

FIG. 11: Strip photoresist and upper oxide layer in trench area; clean; deposit polysilicon; CMP polysilicon stopping on upper silicon nitride layer;

FIG. 12: Remove upper silicon nitride layer, upper oxide layer, and lower nitride layer; clean; re-oxide or deposit uppermost oxide layer;

FIG. 13: Deposit uppermost silicon nitride film;

FIG. 14: Uppermost silicon nitride film dry etch back stopping on pad dielectric layer and uppermost oxide layer; source/drain implant; remove uppermost oxide layer;

FIG. 15: Deposit silicide film; rapid thermal anneal (RTA); unreacted silicide film etch back; form silicide on gate and source/drain areas.

Accordingly as shown in FIG. 1, starting semiconductor structure 10 includes an upper silicon layer and is understood to possibly include a semiconductor wafer or substrate, active and passive devices formed within the wafer. The term "semiconductor structure" is meant to include devices formed within a semiconductor wafer and the layers overlying the wafer.

Unless otherwise specified, all structures, layers, etc. may be formed or accomplished by conventional methods known in the prior art.

Pad oxide/dielectric layer 12 is grown over semiconductor structure 10 to a thickness of from about 100 to 200 Å, and more preferably from about 100 to 150 Å.

A well mask is defined by, for example, depositing a photoresist layer and patterning it to form a patterned photoresist well mask 14 defining well area 16. Well area has a width from about 5 to 0.4 µm, and more preferably from about 1 to 0.4 µm.

A well implant is conducted at 20 from about 1E13 to 1E14 to form well 18 having a concentration from about 1E16 atoms/cm2 to 1E18 atoms/cm2. For example, for a PMOS transistor, phosphorous (P) or arsenic (As) atoms may be implanted to form well 18, and for an NMOS transistor boron (B) atoms may be implanted to form well 18.

As shown in FIG. 2, the well mask, for example patterned photoresist mask 14, is stripped and removed.

The pad oxide/dielectric layer 12 is cleaned by a diluted HF (hydrogen fluoride) wet etch.

Lower silicon nitride (SiN) layer 22 is deposited over cleaned pad oxide/dielectric layer 12. Lower SiN layer 22 has a thickness from about 180 to 220 Å, more preferably from about 190 to 210 Å, and most preferably about 200 Å.

As shown in FIG. 3, lower SiN layer 22 is patterned to define a gate mask over lower gate area 24. This may be accomplished by, for example, depositing and patterning photoresist layer 26 then etching lower SiN layer 22 by a plasma dry etch, for example, stopping on pad oxide/dielectric layer portion 12'. Pad oxide/dielectric layer 12' within lower gate area 24 is thinned by the etch and has a thickness from about 80 to 130 Å, and more preferably from about 80 to 90 Å.

A mask (not shown) having a specified aperture width may be used to expose the photoresist layer to form patterned photoresist layer 26.

Lower gate area 24 has a width from about 0.1 to 0.25 µm, and more preferably from about 0.12 to 0.15 µm and exposed pad oxide portion 12'.

As shown in FIG. 4, patterned photoresist layer 26 is stripped and removed.

Pad oxide portion 12' within lower gate area 24 is stripped and removed to expose a portion of the silicon layer of semiconductor structure 10 within lower gate area 24.

The silicon layer of semiconductor structure 10 is then etched to form trench 28. The depth of trench 28 at 30 within the upper silicon layer of semiconductor structure 10 beneath pad oxide/dielectric layer 12 is from about 800 to 1200 Å, and more preferably about 1000 Å.

As shown if FIG. 5, sacrificial liner oxide layer 32 is grown in trench 28 over the exposed silicon layer in semiconductor structure 10 and pad oxide/dielectric layer 12 to a thickness of about 100 to 150 Å, and more preferably about 100 Å.

A threshold implant is conducted at 38 from about 1E12 to 1E13, and more preferably about 1E12 to form threshold implant 34 having a concentration from about 1E17 atoms/cm2 to 1E18 atoms/cm2. For a PMOS transistor N atoms are implanted and for an NMOS transistor, P atoms are implanted.

A punchthrough implant is conducted at 38 to form punchthrough implant 36 from about 1E13 to 5E13, and more preferably at about 1E13 and having a concentration from about 1E17 atoms/cm2 to 1E18 atoms/cm2. For a PMOS transistor N atoms are implanted and for an NMOS transistor, P atoms are implanted.

As shown in FIG. 6, sacrificial liner oxide layer 32 is stripped and removed followed by a wet cleaning process to clean the exposed upper silicon layer of semiconductor structure 10.

As shown in FIG. 7, gate oxide layer 40 is grown over the exposed upper silicon layer of semiconductor structure 10 and pad oxide/dielectric layer 12. Gate oxide layer 40 is from about 15 to 40 Å thick, and more preferably from about 20 to 30 Å.

As shown in FIG. 8, conductive layer 42 (e.g. polysilicon) is deposited over silicon nitride layer 22, filling trench 28. Layer 42 may be comprised of polysilicon, metal, or metal silicide, for example. Layer 42 is from about 2500 to 3000 Å thick, and more preferably about 2500 Å thick.

As shown in FIG. 9, layer 42 is planarized by a first chemical-mechanical polishing (CMP) stopping on silicon nitride layer to form planarized lower polysilicon gate portion 44. Lower poly gate portion has a width 46 from about 0.11 to 0.25 µm, and more preferably from about 0.12 to 0.15 µm.

As shown in FIG. 10, lower poly gate portion 44 is cleaned to remove any oxide formed thereon and upper silicon oxide layer 48 is deposited over lower SiN layer 12 and lower poly gate layer 44. Upper oxide layer 48 is from about 100 to 150 Å thick, and more preferably about 100 Å thick.

Upper SiN layer 50 is then deposited over upper oxide layer 48. Upper SiN layer 50 is from about 500 to 700 Å thick, and more preferably about 500 Å thick.

Upper SiN layer 50 is then patterned to define upper gate trench 52. This may be accomplished by, for example, depositing and patterning photoresist layer 54 then etching upper SiN layer 50 by a plasma dry etch, for example, stopping on upper oxide layer portion 48'. Gate trench 52 has a depth from about 560 to 780 Å, and more preferably about 570 Å.

Oxide layer portion 48' within upper gate trench is thinned by the etch and has a thickness from about 60 to 80 Å, and more preferably about 70 Å.

The photoresist layer 54 has "oversized gate opening" compared to the photoresist layer 26 and gate opening 24. Various techniques can be used to create the "oversized" photoresist layer 54. For example, an oversized optical mask may be used.

Alternatively, the same optical mask (not shown) having a specified aperture width used to expose photoresist layer forming patterned photoresist layer 26 (see above) may be used to expose the photoresist layer to form patterned photoresist layer 54. This can be accomplished by overexposing photoresist layer 54 through the mask thus forming upper gate trench 52 that has a width at 56 that is greater than the width 46 of lower poly gate portion 44. Width 56 of upper gate trench 52 is from about 0.14 to 0.31 μm.

As shown in FIG. 11, patterned photoresist layer 54 and upper oxide layer portion 48' within upper gate trench 52 are stripped and removed. Lower poly gate portion 44 is cleaned to remove any oxide formed thereon.

A layer of polysilicon (not shown) is deposited over upper SiN layer 50, filling the trench within gate trench 52. The polysilicon layer is planarized by a second CMP and stopping on upper SiN layer 50 to form upper poly gate portion 58 having width 56.

Lower poly gate portion 44 and upper poly gate portion 58 together form T-shaped poly gate 60.

It is noted that two CMP processes are used to form T-shaped poly gate 60. That is, a first CMP process is used to form lower poly gate portion 44 and a second CMP process is used to form upper poly gate portion 58.

As shown in FIG. 12, upper SiN layer 50, upper oxide layer 48, and lower SiN layer 22 are preferably removed in a single etch step using HPO$_3$, for example. This exposes upper poly gate portion 58 and lower poly gate portion 44 above pad oxide/dielectric layer 12.

Exposed upper poly gate portion 58 and lower poly gate portion 44 above pad oxide/dielectric layer 12 are cleaned and uppermost oxide layer 62 is formed thereover. Uppermost oxide layer 62 may be formed by: re-oxidizing exposed upper poly gate portion 58 and lower poly gate portion 44 above pad oxide/dielectric layer 12; or depositing a silicon oxide layer thereover.

As shown in FIG. 13, uppermost SiN layer 64 is deposited over pad oxide/dielectric layer 12 and uppermost oxide layer 62 by LPCVD.

Uppermost SiN film 64 conforms to the shape of the portion of T-shaped poly gate 60 above pad oxide/dielectric layer 12 and is thicker on the horizontal portions of pad oxide/dielectric layer 12 and uppermost oxide layer 62 than the vertical portions of uppermost oxide layer 62. Most importantly, uppermost SiN film 64 is deposited under overhangs 66 of upper poly gate portion 58 of T-shaped poly gate 60.

As shown in FIG. 14, uppermost SiN film 64 is removed by a dry anisotropic etch stopping on pad oxide/dielectric layer 12 and uppermost oxide layer 62.

LDD (low doped source/drains) implants 65 may be formed by an angled LDD ion implantation (I/I).

As shown in FIG. 15, patterned photoresist layer 54 is stripped and removed leaving SiN sidewall spacers 70 underneath overhangs 66. Sidewall spacers 70 have a width from about 100 to 150 Å, and more preferably about 100 Å.

An ion implantation is performed at 72 from about 1E13 to 1E15, and more preferably from about 1E14 to 1E15 to form heavily doped source/drain areas (HDD) 68. HDD areas 68 are more shallow than LDD areas 68.

Pad oxide/dielectric layer 12 and exposed uppermost oxide layer 62 are removed, exposing the upper silicon layer of semiconductor structure 10 and the vertical sides and upper surface of upper oxide gate portion 58.

The upper silicon layer of semiconductor structure 10 and the vertical sides and upper surface of upper oxide gate portion 58 may then be cleaned.

A metal film (not shown) comprised of Ti or Co, and preferably titanium cobalt (Ti/Co) is deposited over the exposed horizontal portions of the structure and the exposed vertical sides of upper poly gate portion 58. A rapid thermal anneal (RTA) is then applied to form salicide (self-aligned silicide) portions 74 over S/D regions 68 and silicide portion 76 over upper poly gate portion 58 of T-shaped poly gate 60 to complete formation of the NMOS or PMOS transistor, as desired, having junction 78. The unreacted metal film (on spacers 70 and other protected non-silicon areas) is then etched back.

S/D silicide regions 74 have a thickness from about 300 to 500 Å, and more preferably from about 300 to 400 Å. T-shaped gate silicide region 76 has a thickness from about 300 to 500 Å, and more preferably from about 300 to 400 Å.

Junction 78 has a depth below S/D silicide regions from about 800 to 1000 Å.

The formation of upper poly gate portion 58 having a greater width than lower poly gate portion 44 increases the gate surface area by formation of the T-shape of T-shaped poly gate 60. This effectively reduces the overall rho (resistance) of T-shaped poly gate 60.

Further, recessing lower poly gate portion 44 in effect elevates S/D regions 68. This also reduces S/D regions 68 lateral diffusion and helps to solve the junction 78 leakage issue by allowing a deeper junction 78 than with previous processes.

Although a NMOS/PMOS transistor semiconductor device having a T-shaped poly gate was described, other semiconductor devices may be formed using the T-shaped poly gate of the present invention.

Second Embodiment of the Invention

The second embodiment of the invention is shown in FIGS. 1 to 9 and 16–19.

Figure 17:
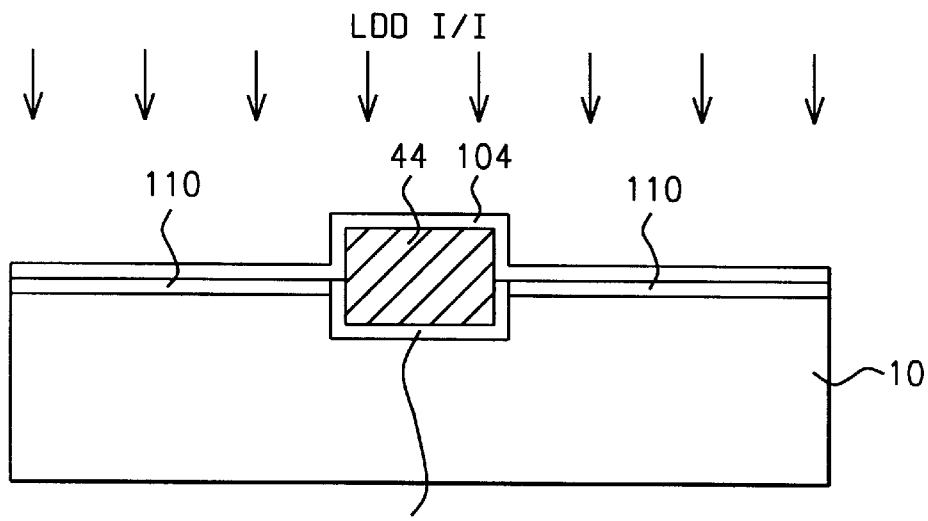

The steps shown in FIGS. 1 to 9 are performed as described above in the first embodiment. These steps are summarized as follows:

form a pad layer and a lower nitride layer over a substrate;

pattern the lower nitride layer and the pad layer to form a gate opening over a gate area on the substrate; etch the substrate through the gate opening in the lower gate area to form a gate trench in the substrate;

form a gate oxide layer on the sidewalls and bottom of the gate trench;

form a gate over the gate oxide layer within the gate trench;

remove the lower SiN layer and the pad oxide/dielectric layer;

As shown in FIG. 17, we form a first oxide layer 104 over the gate and the substrate. The first oxide layer 104 preferably has a thickness of between about 100 and 150 Å.

Next, preferably a RCA clean (($NH_4OH$: $H_2O_2$) and ($HCl:H_2O_2$))is used to clean the first oxide layer 104 surface.

Next, LDD regions 110 are formed adjacent to the gate. The LDD region are preferably formed by an angled ion implant at an energy between 1E14 and 1E15 Kev. LDD regions 110 are about 1000 to 1500 Å below the substrate surface.

Figure 18:
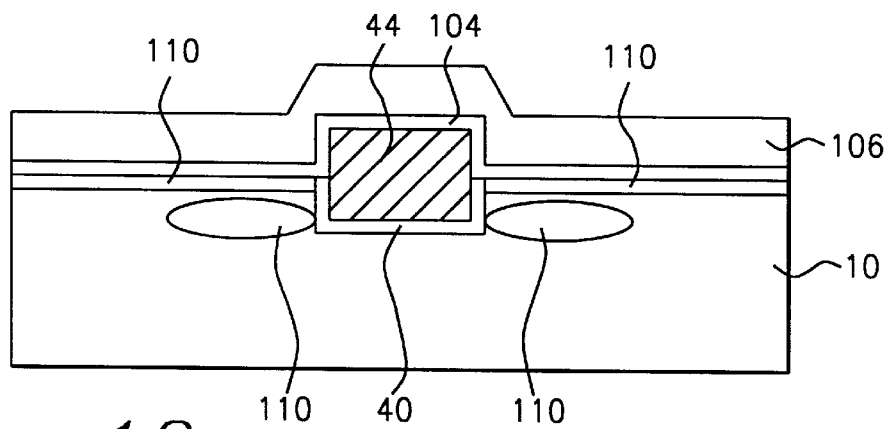

As shown in FIG. 18, we form a first nitride layer 106 over the first oxide layer 104. The first nitride layer 106 preferably has a thickness of between about 800 and 1500 Å.

Figure 19:
Figure 19:
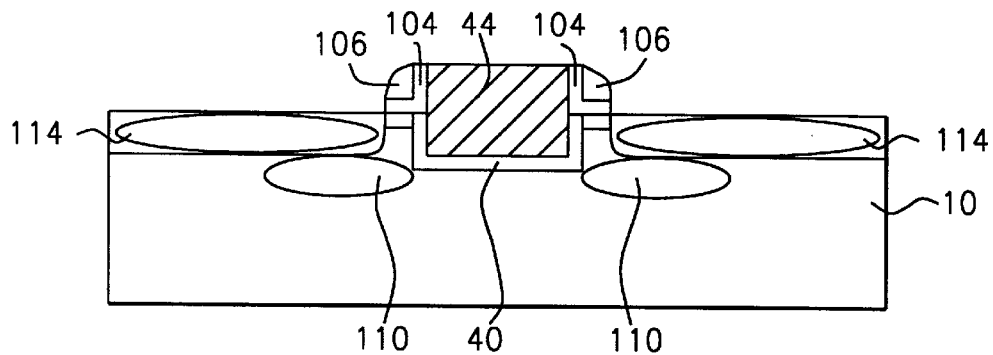

Referring to FIG. 19 we etch the first nitride layer 106 and the first oxide layer to form first and second spacers 104 106 on the sidewalls of the gate 44.

Figure 20:
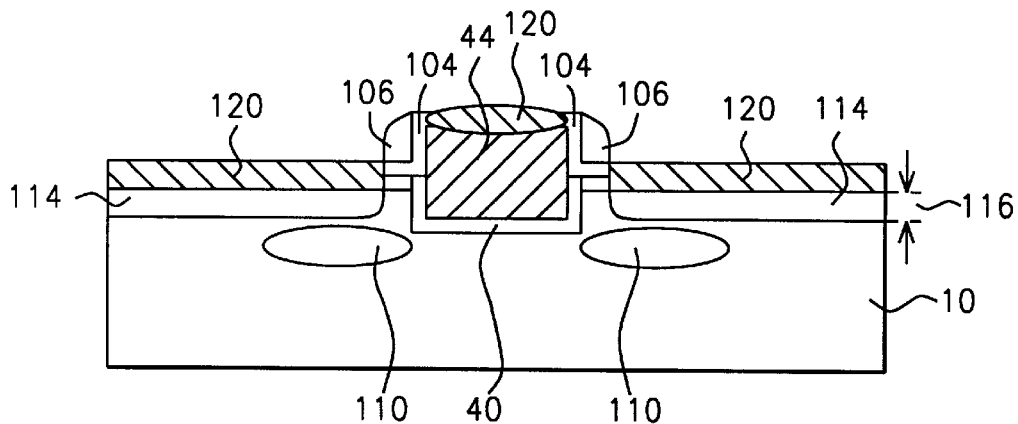

As shown in FIGS. 19 and 20, source and drain regions 114 are formed adjacent to the first and second spacers. The recessed poly gate 44 effective gate length can be accurately controlled by the S/D implant energy. The S/D regions preferably have a junction depth 116 between about 800 and 1000 Å below the substrate surface.

Still referring to FIG. 20, we form silicide contacts 120 to the source and drain regions and silicide gate contacts 120 to the gate 44. The silicide contact are preferably formed by depositing Ti/Cobalt and rapid thermal annealing. The unreacted metal is etched back to form the contacts shown in FIG. 20.

This embodiment can solve the conflict of the shallow S/D junction with the silicide process. The embodiment's recessed poly gate 44 is easy to control the effective gate length by accurately controlling the S/D implant energy.

While particular embodiments of the present invention have been illustrated and described, it is not intended to limit the invention, except as defined by the following claims.

We claim:

1. A method of fabricating a semiconductor transistor device, comprising the steps of:
    forming a pad layer and a lower nitride layer over a substrate;
    patterning said lower nitride layer and said pad layer to form a gate opening over a gate area on said substrate;
    etching said substrate through said gate opening in said lower gate area to form a gate trench in said substrate;
    forming a gate oxide layer on the sidewalls and bottom of said gate trench;
    forming a gate over said gate oxide layer within said gate trench;
    removing said lower SiN layer and said pad dielectric layer;
    forming a first oxide layer over said gate and said substrate;
    forming low doped drain (LDD) regions adjacent to said gate;
    forming a first nitride layer over said first oxide layer;
    etching said first nitride layer and said first oxide layer to form first and second spacers on the sidewalls of said gate;
    forming source and drain regions adjacent to said first and second spacers;
    forming silicide contacts to said source and drain regions and silicide gate contacts to said gate.

2. The method of claim 1, wherein said LDD regions are from about 1000 to 1500 Å below the surface of said substrate.

3. The method of claim 1, wherein said first nitride layer is from about 800 to 1500 Å thick.

4. The method of claim 1, wherein said source and drain has a junction depth from about 800 and 1000 Å below the surface of said substrate.

5. The method of claim 1, wherein said first oxide layer is from about 100 to 150 Å thick.

6. The method of claim 1, wherein said LDD regions are formed using an angled ion implant.

7. The method of claim 1, wherein said LDD regions are formed using an angled ion implant at an energy of from about 1E14 to 1E15 keV.

8. The method of claim 1, wherein said silicide contacts are formed by depositing Ti/cobalt and then conducting a rapid thermal anneal.

9. The method of claim 1, wherein said pad layer is comprised of pad oxide having a thickness of from about 100 to 200 Å and said lower nitride layer has a thickness of from about 180 to 220 Å.

10. The method of claim 1, wherein said pad layer is comprised of pad oxide having a thickness of from about 100 to 150 Å and said lower nitride layer has a thickness of from about 190 to 210 Å.

11. The method of claim 1, wherein said gate trench as a width of from about 800 to 1200 Å.

12. The method of claim 1, wherein said gate oxide layer has a thickness of from about 15 to 40 Å.

13. The method of claim 1, wherein said gate oxide layer has a thickness of from about 20 to 30 Å.

14. A method of fabricating a semiconductor transistor device, comprising the steps of:
    forming a pad layer and a lower nitride layer over a substrate; said pad layer having a thickens of from about 100 to 200 Å and said lower nitride layer having a thickness of from about 180 to 220 Å;
    patterning said lower nitride layer and said pad layer to form a gate opening over a gate area on said substrate;
    etching said substrate through said gate opening in said lower gate area to form a gate trench in said substrate;
    forming a gate oxide layer on said sidewalls and bottom of said gate trench;
    forming a gate over said gate oxide layer within said gate trench;
    removing said lower nitride layer and said pad dielectric layer;
    forming a first oxide layer over said gate and said substrate;
    forming low doped drain (LDD) regions adjacent to said gate;
    forming a first nitride layer over said first oxide layer;
    etching said first nitride layer and said first oxide layer to form first and second spacers on said sidewalls of said gate;
    forming source and drain regions adjacent to said first and second spacers;
    forming silicide contacts to said source and drain regions and silicide gate contacts to said gate.

15. The method of claim 14, wherein said LDD regions are from about 1000 to 1500 Å below said surface of said substrate.

16. The method of claim 14, wherein said first nitride layer is from about 800 to 1500 Å thick.

17. The method of claim 14, wherein said source and drain has a junction depth from about 800 and 1000 Å below said surface of said substrate.

18. The method of claim 14, wherein said first oxide layer is from about 100 to 150 Å thick.

19. The method of claim 14, wherein said LDD regions are formed using an angled ion implant.

20. The method of claim 14, wherein said LDD regions are formed using an angled ion implant at an energy of from about 1E14 to 1E15 keV.

21. The method of claim 14, wherein said silicide contacts are formed by depositing Ti/cobalt and then conducting a rapid thermal anneal.

22. The method of claim 14, wherein said pad layer is comprised of pad oxide.

23. The method of claim 14, wherein said pad layer is comprised of pad oxide having a thickness of from about 100 to 150 Å and said lower nitride layer has a thickness of from about 190 to 210 Å.

24. The method of claim 14, wherein said gate trench as a width of from about 800 to 1200 Å.

25. The method of claim 14, wherein said gate oxide layer has a thickness of from about 15 to 40 Å.

26. The method of claim 14, wherein said gate oxide layer has a thickness of from about 20 to 30 Å.

27. A method of fabricating a semiconductor transistor device, comprising the steps of:

forming a pad layer and a lower nitride layer over a substrate; said pad layer having a thickness of from about 100 to 200 Å and said lower nitride layer having a thickness of from about 180 to 220 Å;

patterning said lower nitride layer and said pad layer to form a gate opening over a gate area on said substrate;

etching said substrate through said gate opening in said lower gate area to form a gate trench in said substrate;

forming a gate oxide layer on said sidewalls and bottom of said gate trench;

forming a gate over said gate oxide layer within said gate trench;

removing said lower nitride layer and said pad dielectric layer;

forming a first oxide layer over said gate and said substrate;

forming low doped drain (LDD) regions adjacent to said gate; said low doped drain (LDD) regions being from about 1000 to 1500 Å below said surface of said substrate;

forming a first nitride layer over said first oxide layer;

etching said first nitride layer and said first oxide layer to form first and second spacers on said sidewalls of said gate;

forming source and drain regions adjacent to said first and second spacers;

forming silicide contacts to said source and drain regions and silicide gate contacts to said gate.

28. The method of claim 27, wherein said first nitride layer is from about 800 to 1500 Å thick.

29. The method of claim 27, wherein said source and drain has a junction depth from about 800 and 1000 Å below said surface of said substrate.

30. The method of claim 27, wherein said first oxide layer is from about 100 to 150 Å thick.

31. The method of claim 27, wherein said LDD regions are formed using an angled ion implant.

32. The method of claim 27, wherein said LDD regions are formed using an angled ion implant at an energy of from about 1E14 to 1E15 keV.

33. The method of claim 27, wherein said silicide contacts are formed by depositing Ti/cobalt and then conducting a rapid thermal anneal.

34. The method of claim 27, wherein said pad layer is comprised of pad oxide.

35. The method of claim 27, wherein said pad layer is comprised of pad oxide having a thickness of from about 100 to 150 Å and said lower nitride layer has a thickness of from about 190 to 210 Å.

36. The method of claim 27, wherein said gate trench as a width of from about 800 to 1200 Å.

37. The method of claim 27, wherein said gate oxide layer has a thickness of from about 15 to 40 Å.

38. The method of claim 27, wherein said gate oxide layer has a thickness of from about 20 to 30 Å.

* * * * *